(12) United States Patent
Ohta et al.

(10) Patent No.: US 9,024,352 B2
(45) Date of Patent: May 5, 2015

(54) GLASS CERAMIC BODY, SUBSTRATE FOR MOUNTING LIGHT-EMITTING ELEMENT, AND LIGHT EMITTING DEVICE

(71) Applicant: Asahi Glass Company, Limited, Chiyoda-ku (JP)

(72) Inventors: Seigo Ohta, Tokyo (JP); Masamichi Tanida, Tokyo (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 0 days.

(21) Appl. No.: 14/176,414

(22) Filed: Feb. 10, 2014

(65) Prior Publication Data

US 2014/0177241 A1    Jun. 26, 2014

Related U.S. Application Data

(63) Continuation of application No. PCT/JP2012/069752, filed on Aug. 2, 2012.

(30) Foreign Application Priority Data

Aug. 9, 2011  (JP) .................................. 2011-174261

(51) Int. Cl.
*H01L 33/48*  (2010.01)
*H01L 33/60*  (2010.01)
*C03C 10/00*  (2006.01)
(Continued)

(52) U.S. Cl.
CPC ................. *C03C 14/004* (2013.01); *C03C 4/16* (2013.01); *H01L 23/15* (2013.01); *H01L 23/36* (2013.01); *H01L 33/44* (2013.01); *H01L 33/486* (2013.01); *C03B 19/06* (2013.01); *C03C 2214/04* (2013.01); *H01L 2224/48091* (2013.01);
(Continued)

(58) Field of Classification Search
CPC ...... H01L 33/48; H01L 33/483; H01L 33/486
USPC .................................... 257/98, 99; 501/2, 153
See application file for complete search history.

(56) References Cited

U.S. PATENT DOCUMENTS 3,935,017 A *   1/1976   Gardner ......................... 501/153
4,020,234 A *   4/1977   Gardner ......................... 428/433
(Continued)

FOREIGN PATENT DOCUMENTS

CN        1558876 A       12/2004
JP        9-71472          3/1997
(Continued)

OTHER PUBLICATIONS

U.S. Appl. No. 14/176,285, filed Feb. 10, 2014, Ohta, et al.
(Continued)

*Primary Examiner* — Evan Pert
(74) *Attorney, Agent, or Firm* — Oblon, McClelland, Maier & Neustadt, L.L.P.

(57) ABSTRACT

To provide a glass ceramic body wherein the deterioration of the reflectance due to black coloration is suppressed, and the unevenness of the firing shrinkage is suppressed.
A glass ceramic body comprising a glass matrix and alumina particles dispersed therein, wherein the glass matrix is not crystallized, a ceramic part composed of the dispersed alumina particles has an α-alumina crystal structure and a crystal structure other than the α-alumina crystal structure.

17 Claims, 1 Drawing Sheet

(51) Int. Cl.

| | | |
|---|---|---|
| *C04B 35/10* | (2006.01) | |
| *C04B 35/101* | (2006.01) | |
| *C03C 14/00* | (2006.01) | |
| *C03C 4/16* | (2006.01) | |
| *H01L 23/15* | (2006.01) | |
| *H01L 23/36* | (2006.01) | |
| *C03B 19/06* | (2006.01) | |
| *F21V 21/00* | (2006.01) | |
| *H01L 33/44* | (2010.01) | |

(52) U.S. Cl.
CPC ............... *H01L2224/48227* (2013.01); *H01L 2224/48137* (2013.01); *F21V 21/00* (2013.01)

(56) References Cited

U.S. PATENT DOCUMENTS

| | | | | |
|---|---|---|---|---|
| 4,960,738 | A | * 10/1990 | Hori et al. | ............ 501/128 |
| 5,047,374 | A | * 9/1991 | Nicholson et al. | ............ 501/127 |
| 5,053,370 | A | * 10/1991 | Berneburg | ............ 501/153 |
| 5,902,758 | A | * 5/1999 | Hazeyama et al. | ............ 501/5 |
| 7,053,016 | B2 | * 5/2006 | Mizuno et al. | ............ 501/32 |
| 8,541,805 | B2 | * 9/2013 | Motoya et al. | ............ 257/98 |
| 8,604,499 | B2 | * 12/2013 | Nakayama et al. | ............ 257/98 |
| 8,680,546 | B2 | * 3/2014 | Konishi et al. | ............ 257/98 |
| 8,753,992 | B2 | * 6/2014 | Imakita | ............ 501/32 |
| 2012/0300479 | A1 | 11/2012 | Okada et al. | |

FOREIGN PATENT DOCUMENTS

| | | |
|---|---|---|
| JP | 9-295827 | 11/1997 |
| JP | 10-251056 | 9/1998 |
| JP | 2001-10858 | 1/2001 |
| JP | 2001-10868 | 1/2001 |
| JP | 2001-48639 | 2/2001 |
| JP | 2002-111210 | 4/2002 |
| JP | 2007-121613 | 5/2007 |
| WO | 2010/021367 | 2/2010 |

OTHER PUBLICATIONS

International Search Report issued Oct. 30, 2012 in PCT/JP2012/069752 filed Aug. 2, 2012.
U.S. Appl. No. 14/481,387, filed Sep. 9, 2014, Tanida, et al.

\* cited by examiner

GLASS CERAMIC BODY, SUBSTRATE FOR MOUNTING LIGHT-EMITTING ELEMENT, AND LIGHT EMITTING DEVICE

TECHNICAL FIELD

The present invention relates to a glass ceramic body, a substrate for mounting a light emitting element, and a light emitting device.

BACKGROUND ART

In recent years, along with a tendency to high brightness and whitening of a light emitting device having a light emitting element such as a light emitting diode, a light emitting device using a light emitting element has been used for a backlight of a mobile phone, a liquid crystal TV, etc. In such a light-emitting device, a substrate is required to have a high thermal conductivity, be able to quickly dissipate heat generated from the light-emitting element and have a high reflectance and excellent productivity.

In order to satisfy such requirements, it has been studied to use a glass ceramic substrate as a substrate for a light emitting device. The glass ceramic substrate comprises a glass powder and a ceramic powder such as an alumina powder and has a large difference in refractive index between glass and ceramics and many interfaces between them. Thus, the glass ceramic substrate has a higher reflectance than conventional ceramic substrates. However, the glass ceramic substrate is required to have a further high reflectance to be used as a substrate for mounting a light emitting element.

Further, for reducing unevenness in various properties such as reflectance and strength, the glass ceramic substrate is also required to have a property to suppress shrinkage at the time of firing, namely firing shrinkage.

In order to increase the reflectance of a glass ceramic substrate, a method of incorporating ceramic particles having a refractive index higher than that of alumina particles, namely high refractive index particles, has been studied. However, the high refractive index particles tend to have a low sintering property. Accordingly, the content of the high refractive index particles cannot be made high, or the composition of glass is significantly restricted. Thus, the degree of freedom of the design is decreased. Accordingly, in order to make it possible to select the glass composition from a wide range, it is desired to increase the reflectance and reduce firing shrinkage by using alumina particles or the like having good sintering property with glass.

As a method for improving the reflectance, a method of limiting the particle size and the occupation area has been known (for example, Patent Document 1). On the other hand, as a method for suppressing the firing shrinkage, a method of using flat particles and aligning these flat particles in the designated direction has been known (for example, Patent Document 2). Further, as a method for improving the strength, a method of dispersing particles having an aspect ratio of at least 4 has been known (for example, Patent Document 3). Further, it has been known that regarding to the crystal structure, from the viewpoint of the strength, an α-alumina is preferred, and from the viewpoint of the dielectric constant, a γ-alumina is preferred (for example, Patent Document 4).

PRIOR ART DOCUMENTS

Patent Documents

Patent Document 1: JP-A-2007-121613
Patent Document 2: JP-A-09-071472
Patent Document 3: JP-A-2002-111210
Patent Document 4: JP-A-10-251056

DISCLOSURE OF INVENTION

Technical Problem

Here, the inside of a glass ceramic substrate may be provided with a silver layer made of silver or a silver alloy so as to be parallel to the substrate surface in some cases. The silver layer is formed as a reflection layer for improving the reflectance or as a heat release layer for improving a heat release property in the plane direction. However, if a silver layer is formed, silver which is a component of the silver layer melts into the glass ceramics at the time of firing and agglomerates around alumina particles and thereby becomes colloid. If Ag colloids are formed in the glass ceramics, the glass ceramic body becomes black color, and the reflectance becomes low. Such blackening is likely to occur in a case of alumina particles having an α-alumina crystal structure which are conventionally used, and in a case where the shape of the alumina particles is flat, the degree of blackening is remarkable.

Here, in Patent Document 4, it is described to fire a mixture comprising glass, α-alumina particles and γ-alumina particles. However, it is an object of Patent Document 4 that a substrate material is made to be a low dielectric loss for low transmission loss in a high frequency circuit for information transmission, and γ-alumina particles are contained so as to let mullite crystals precipitate at the time of firing. Further, in a case where crystals such as mullite crystals are precipitated at the time of firing, since it is difficult to stably precipitate crystals, the firing shrinkage tends to be uneven, and various properties such as a reflectance and a strength tend to uneven.

The present invention has been accomplished to solve the above problem, and it is an object of the present invention to provide a glass ceramic body wherein the deterioration of a reflectance due to blackening is suppressed, and the unevenness in the firing shrinkage is suppressed, and the unevenness in various properties such as a reflectance and a strength which are caused due to the unevenness of the firing shrinkage is suppressed. Further, it is an object of the present invention to provide a substrate for mounting a light emitting element, which is provided with such a glass ceramic body, and a light emitting device.

Solution to Problem

The glass ceramic body of the present invention comprises a glass matrix and alumina particles, wherein the glass matrix is not crystallized, and a ceramic part composed of the dispersed alumina particles has an α-alumina crystal structure and a crystal structure other than the α-alumina crystal structure. Particularly, the ceramic part preferably has an α-alumina crystal structure and at least one crystal structure selected from the group consisting of a δ-alumina and a θ-alumina.

The substrate for mounting a light emitting element, of the present invention is a substrate for mounting a light emitting element, on which a light emitting element is to be mounted and which comprises the glass ceramic body of the present invention.

The light emitting device of the present invention comprises the substrate for mounting a light emitting element, of the present invention and a light emitting element mounted on the substrate for mounting a light emitting element.

The expression "to" showing the above numerical range is used to include the numerical values before and after thereof as the lower limit value and the upper limit value, and hereinafter in this specification, "to" is used to have the same meaning unless otherwise specified.

Advantageous Effects of Invention

According to the glass ceramic body of the present invention, alumina particles are dispersed in the glass matrix, the glass matrix is not crystallized, and a ceramic part composed of the dispersed alumina particles has an α-alumina crystal structure and a crystal structure other than the α-alumina crystal structure, whereby the deterioration of the reflectance due to blackening is suppressed, and the unevenness in the firing shrinkage is suppressed. Thus, by providing a substrate for mounting a light emitting element or a light emitting device with the glass ceramic body of the present invention, their properties can be improved.

DESCRIPTION OF EMBODIMENTS

Figure 1:
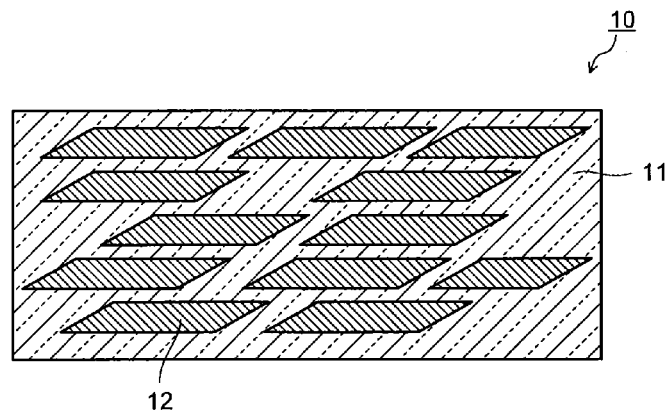
FIG. 1 is a schematic cross-sectional view illustrating a glass ceramic body in an embodiment of the present invention.
Figure 2:
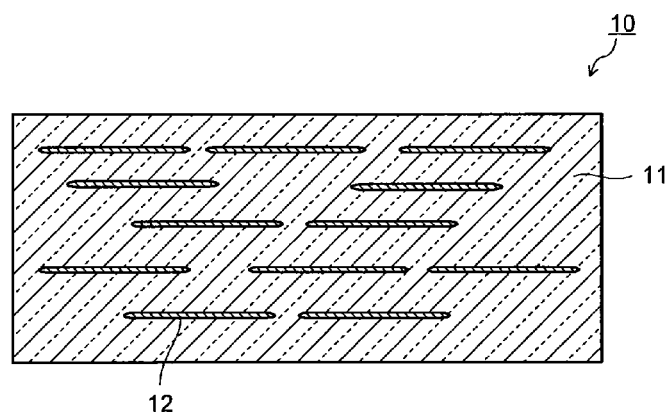
FIG. 2 is a schematic cross-sectional view illustrating a cross section along the thickness direction of the flat alumina particles in the glass ceramic body of the present invention.

Now, the embodiment of the present invention will be described in detail. FIG. 1 is a view explaining one mode for carrying out the present invention and shows a schematic cross-sectional view illustrating a plane on which the alumina particles are aligned in a plate state in the glass ceramic body containing the flat alumina particles. Further, in FIG. 1, the flat alumina particles are schematically represented as plate shape parallelogram. FIG. 2 shows a schematic view at a cross section which is in a relation of the normal direction to the cross section of FIG. 1.

In Figs, a glass ceramic body 10 has a glass matrix 11 and at least alumina particles 12 dispersed therein, the glass matrix 11 is not crystallized, and a ceramic part (namely, in Fig., a part of excluding the glass matrix 11 from the glass ceramic body 10) composed of the dispersed alumina particles 12 has an α-alumina crystal structure and a crystal structure other than the α-alumina crystal structure. As the alumina particles which constitute the ceramic part, alumina particles having an α-alumina crystal structure and alumina particles having a crystal structure other than the α-alumina structure may be mixed, or in one alumina particle, an α-alumina crystal structure and a crystal structure other than the α-alumina crystal structure may exist. From the viewpoint of preventing blackening, it is preferred that the alumina particles 12 have an α-alumina crystal structure and a crystal structure other than the α-alumina crystal structure (for example, θ-alumina crystal structure).

The glass matrix 11 is "not be crystallized" means that crystals which precipitate from glass derived from a glass powder as a starting material do not exist. That is, it means that the glass matrix 11 is amorphous. It can be confirmed by X-ray diffraction that the glass matrix 11 is not crystallized. In this judgment, when the highest intensity (absolute value) of a peak derived from ceramic particles such as alumina particles 12 in the X-ray diffraction spectrum is 100, one from which no peak derived from glass and having an intensity of at least 10 as the absolute value is observed is judged to be not crystallized one.

In the present invention, it is particularly preferred that mullite crystals will not precipitate in the glass matrix, from the viewpoint of the shape of the glass ceramic body and reducing the unevenness in properties. Thus, the glass matrix of the glass ceramic body particularly preferably contains substantially no mullite crystal. In this specification, "substantially contains no mullite crystal" means that when the glass matrix is analyzed by X-ray diffraction, a clear peak of the mullite crystals is not observed.

According to such a glass ceramic body 10, since crystals will not precipitate on the glass matrix 11 at the time of firing, unevenness in the firing shrinkage can be suppressed. Thus, the unevenness in various properties such as the unevenness in the reflectance or the strength can be suppressed. Further, since crystals will not precipitate, the change in the thermal expansion coefficient can be suppressed, and warpage, etc. can be suppressed. Further, the decrease of glass due to precipitation of crystals can be suppressed, and thereby the amount of ceramic particles containing alumina particles 12 to be introduced can be increased.

Further, when the ceramic part composed of the dispersed alumina particles 12 has an α-alumina crystal structure and a crystal structure other than the α-alumina crystal structure, blackening due to the formation of a silver layer can be suppressed, and the strength of the glass ceramic body 10 can be maintained. Specifically, the blackening due to the formation of a silver layer can be suppressed, by the crystal structure such as θ-alumina other than the α-alumina, and the strength of the glass ceramic body 10 can be maintained by the α-alumina crystal structure. The mechanism for suppressing blackening is not necessarily clear. However, it is considered that in a case of only an α-alumina crystal structure, silver ions remain around a surface of the alumina particles and become colloid, and thereby blackening results. On the other hand, when the ceramic part has a crystal structure other than the α-alumina crystal structure, silver ions are captured in the inside of the alumina particles, and thereby blackening tends not to result.

Glass which constitutes the glass matrix 11 is not particularly restricted so long as crystals are not formed at the time of firing within the range of the firing temperature, however, one having a difference in refractive index of at least 0.15 from alumina is preferred. That is, when the refractive index of glass is a, and the refractive index of alumina is b, the absolute value of (b−a) is preferably at least 0.15, more preferably at least 0.17, particularly preferably at least 0.19. When the difference in the refractive index between glass and alumina is at least 0.15, scattering at interfaces is excellent, and a reflectance is high.

As such glass, $SiO_2$—$B_2O_3$ glass is preferred, $SiO_2$—$B_2O_3$—MO (M: alkaline earth metal) glass is more preferred, and $SiO_2$—$B_2O_3$—$Al_2O_3$—MO (M: alkaline earth metal) glass is particularly preferred.

The refractive index of such glass can be calculated by using Appen coefficient. Additive factors (coefficients) of respective components in silicate glass containing alkalis are shown in Table 1 (Source: A. A. Appen: chemicals of glass, NISSO TSUSHINSHA (1974) pp. 318).

TABLE 1

| | Additive factors |
|---|---|
| $SiO_2$ | 1.46~1.48 |
| $B_2O_3$ | 1.46~1.71 |
| $Al_2O_3$ | 1.52 |
| MgO | 1.61 |
| CaO | 1.73 |
| SrO | 1.78 |
| $Na_2O$ | 1.59 |
| $K_2O$ | 1.58 |

TABLE 1-continued

| | Additive factors |
|---|---|
| TiO$_2$ | 2.13 |
| ZrO$_2$ | 2.2 |
| LiO | 1.7 |
| ZnO | 1.71 |

In each type of the above glass, SiO$_2$ and B$_2$O$_3$ to be glass network formers and Al$_2$O$_3$ to improve the stability, the chemical durability and the strength of glass, are preferably contained in at least certain proportions, also with a view to preparing glass having a low refractive index. The total content of SiO$_2$, B$_2$O$_3$ and Al$_2$O$_3$ is at least 57 mol %, preferably at least 62 mol %, further preferably at least 67 mol %.

An alkaline earth metal oxide is added so as to improve the stability of glass, to lower the glass melting temperature or the glass transition point (Tg) and improve the sintering property. As the alkaline metal oxide, CaO is particularly preferred, since the sintering property in a case where the alumina particles 12 are made to be flat is improved. From the viewpoint of the stability of glass, glass melting temperature, the glass transition point (Tg), the sintering property, etc., the content of the alkaline earth metal oxide is preferably from 15 to 40 mol %. When the content of the alkaline earth metal oxide is at least 15 mol %, the glass melting temperature can be suppressed from excessively rising. On the other hand, when the content of the alkaline earth metal oxide is at most 40 mol %, the refractive index of the glass can be suppressed from being excessively high, and the difference in refractive index from alumina can be made large, and thereby the reflectance can be made high. The content of the alkaline earth metal oxide is more preferably from 18 to 38 mol %, further preferably from 20 to 35 mol %.

An alkali metal oxide such as K$_2$O or Na$_2$O to lower the glass transition point (Tg) may be added in an amount of from 0 to 10 mol %. Such an alkali metal oxide is preferably contained with a view to preparing a low refractive index glass, since its degree of increasing the refractive index is remarkably low as compared with the alkaline earth metal oxide. However, if the total content of K$_2$O and Na$_2$O exceeds 10 mol %, the chemical durability particularly the acid resistance may be decreased, and the electrical insulating properties may be decreased. The total content of K$_2$O and Na$_2$O is preferably from 1 to 8 mol %, more preferably from 1 to 6 mol %.

ZnO, TiO$_2$ and SnO may be added for the purpose of lowing the softening point like the alkaline earth metal oxide. However, the addition amount of such components is preferably suppressed to be at most 20 mol %, since their degree of increasing the refractive index is high as compared with other additive components.

As a typical example of glass of the glass matrix, SiO$_2$—B$_2$O$_3$ glass containing from 15 to 40 mol % of CaO as represented by oxide is mentioned. In this glass, SiO$_2$ is preferably from 38 to 60 mol %, and B$_2$O$_3$ is preferably from 13 to 25 mol %.

Further, the glass is not limited to one consisting of the above components, and may contain other components within a range to satisfy the properties such as the difference in refractive index. If the glass contains other components, their total content is preferably at most 10 mol %, preferably at most 5 mol %.

A ceramic part composed of the dispersed alumina particles 12 has an α-alumina crystals structure and a crystal structure other than the α-alumina crystal structure. The crystal structure other than the α-alumina crystal structure may, for example, be γ-alumina, δ-alumina or θ-alumina. The ceramic part usually preferably has an α-alumina and at least one crystal structure selected from the group consisting of δ-alumina, θ-alumina, η-alumina, χ-alumina and κ-alumina.

In the present invention, if the ceramic part composed of the dispersed alumina particles 12 has a γ-alumina crystal structure, mullite crystals tend to be formed in the glass matrix at the time of firing. Thus, it is preferred that the ceramic part contains substantially no γ-alumina crystal structure. In this specification, "substantially contains no γ-alumina crystal structure" means that when a glass ceramic body is analyzed by X-ray diffraction, a clear peak derived from the γ-alumina is not measured. In the present invention, as the crystal structure other than the α-alumina crystal structure, from the viewpoint of no formation of mullite crystals during firing and the productivity, the θ-alumina or the like is mentioned as a preferred crystal structure.

When the ceramic part composed of the dispersed alumina particles in the glass matrix has an α-crystal structure and a crystal structure other than the α-alumina crystal structure, in the total proportion of the α-alumina crystal structure and the crystal structure other than the α-alumina crystal structure of 100%, the proportion of the α-alumina crystal structure is preferably from 1 to 70%, more preferably from 2 to 60%, further preferably from 5 to 60%. Hereinafter, the proportion of the crystal structure other than the α-alumina crystal structure is referred to as "non α proportion". When the non α proportion is at least 1%, based on the crystal structure other than the α-alumina crystal structure, blackening can be effectively suppressed. Further, when the non α proportion is at most 70%, based on the α-alumina crystal structure, sufficient strength can be maintained. For example, the flexural strength of the glass ceramic body 10 is made to be at least 180 MPa.

The non α proportion is obtained as below. First, a glass ceramic body 10 is dry pulverized by a ball mill made of alumina or the like to obtain a powder sample of the glass ceramic body 10. Then, by using a X-ray diffraction apparatus (manufactured by RIGAKU, tradename: RINT2500, X-ray source: Cu—Kα), X-ray diffraction spectrums are measured, and after removing background, from a height of a peak of an α phase (012 plane) which appears at a position of 2θ=25.6° ($I_{25.6}$) and a height of a peak of a γ phase, a η phase, a χ phase, a κ phase, a θ phase and a δ phase which appear at a position of 2θ=46° ($I_{46}$), an α proportion is calculated by the following formula (1). From this α proportion, the non α proportion is calculated by the following formula (2).

$$\alpha \text{ proportion} = I_{25.6}/(I_{25.6}+I_{46}) \times 100(\%) \quad (1)$$

$$\text{Non } \alpha \text{ proportion} = 100 - \alpha \text{ proportion}(\%) \quad (2)$$

The shape of the alumina particles 12 is not necessarily restricted, however, as schematically shown in FIGS. 1 and 2, the flat shape is preferred. Further, the plane shape of the flat surface is not particularly restricted and may be a circular form, an elliptical form or the like. In the case of the flat shape, the firing shrinkage in the flat direction can be suppressed, whereby high dimensional accuracy, etc. can be realized. The flat alumina particles 12 are preferably dispersed so that their individual thickness directions would be the substantially the same direction, namely so that their individual flat surfaces would be substantially parallel to a certain plane. Hereinafter, "flat shape alumina particles" may sometimes be referred to as "flat alumina particles". Further, in a case where the flat plane has a lengthwise direction and a short direction, for example, in a case of rectangle, parallelogram or ellipse, it is further preferred that the lengthwise direction is the substantially parallel. In such a case, "substantially parallel" means that when observed by a stereoscopic microscope, it can be visually observed as parallel.

For example, in a case where a glass ceramic body 10 is used as a substrate for mounting a light emitting element, the flat alumina particles 12 are dispersed so that the thickness direction of the flat alumina particles 12 would be in the thickness direction of the substrate for mounting a light emitting element, namely so that the flat plane of the flat alumina particles 12 would be parallel to a mounting surface which is a main surface of the substrate for mounting a light emitting element. When a green sheet of a glass ceramic body containing flat alumina particles is produced by a doctor blade method, the flat alumina particles are aligned so that the thickness direction of the flat alumina particles would be perpendicular to the plane direction of the green sheet, such being preferred. Further, according to a doctor blade method, in a case where the flat plane of the flat alumina particles has a longwise direction and a short direction, the flat alumina particles are preferably aligned so that the lengthwise direction would be the substantially parallel to the forming direction in the doctor blade method. Further, the thickness direction of the flat alumina particles 12 is for example, vertical direction on FIG. 2, and the flat direction (namely the lengthwise direction of the substrate) is a direction perpendicular to the thickness direction (in FIG. 1, vertical direction and horizontal direction).

When the alumina particles 12 have a flat shape, and their individual thickness directions are the substantially same direction, the firing shrinkage in the flat direction can be suppressed, and high dimensional accuracy can be realized. Further, when, such alumina particles 12 are used for a substrate for mounting a light emitting element, the number of times that incident light collides with interfaces between the glass matrix 11 and the flat alumina particles 12 can be increased, and a high reflectance can be obtained. By adjusting the size of the flat direction of the flat alumina particles 12, the firing shrinkage in the flat direction can be suppressed.

When a cross section as shown in FIG. 2 is observed, the average length in the flat direction (in Fig. horizontal direction) of the flat alumina particles 12 is preferably from 2 to 10 μm, the average length in the thickness direction (in Fig. vertical directions) is preferably from 0.05 to 0.5 μm. Further, the average aspect ratio (the average length in the flat direction/the average length in the thickness direction) which is a proportion of the average length in the flat direction to the average length in the thickness direction is preferably from 20 to 40. When the flat alumina particles 12 are contained so that when a specific cross section is observed, the designated average length and the designated average aspect ratio can be obtained, the firing shrinkage can be easily suppressed, and a high reflectance can be realized.

Further, the above-mentioned average length in the flat direction and the average length in the thickness direction are averages of values obtained by cutting the glass ceramic body 10 in a plane along the thickness direction as shown in FIG. 2 and measuring the length in the flat direction and the length in the thickness direction of the individual flat fillers 12 at at least 20 points in an optional 100 μm$^2$ cross section by a scanning electron microscope (SEM) and an image analyzer. Further, in a case where a glass ceramic body is prepared by firing a green sheet formed by a doctor blade method, its cutting direction is adjusted to be in a direction substantially parallel to the forming direction in the doctor blade method.

In this specification, the "substantially parallel" means parallel at a level of visual observation, unless otherwise specified.

As the sizes of the flat fillers 12 so as to obtain the above mentioned respective average lengths, as the sizes of the flat alumina particles 12 themselves as a starting material powder, those having an average major diameter of from 2 to 10 μm as an average value of the maximum length in the flat direction and an average thickness of from 0.05 to 0.5 μm as an average value of the length in thickness direction are preferred. Further, those having an average aspect ratio (average major diameter/average thickness) of from 20 to 40 as a ratio of the average major diameter to the average thickness are preferred. As such flat alumina particles, alumina particles obtained by hydrothermal synthesis (for example, tradename: SERATH manufactured by KINSEIMATEC CO., LTD.) may be mentioned.

Further, as a starting material powder, flat alumina particles 12 having different average aspect ratios may be mixed and used. In such a case, the total value of values obtained by multiplying an average aspect ratio of individual flat alumina particles 12 by their abundance proportion is taken as an apparent aspect ratio.

Further, the content of the flat alumina particles 12 in the glass ceramic body 10 is not necessarily restricted. However, in a cross section along the thickness direction of the glass ceramic body as shown in FIG. 2, namely in a cross section along the thickness direction of the flat alumina particles 12, the proportion of area of the flat alumina particles 12 per unit area is preferably from 30 to 50%, more preferably from 35 to 45%. When the proportion of the flat alumina particles 12 is at least 30%, the number of times that incident light colloids with interfaces between the glass matrix 11 and the flat alumina particle 12 is increased, whereby a high reflectance can be obtained, and the firing shrinkage can be suppressed. On the other hand, when the proportion of the flat alumina particles 12 is at most 50%, the proportion of the glass matrix 11 is made to be low, whereby the deterioration of the sintering property can be suppressed.

Further, in the same manner as the above-mentioned average length in the flat direction and the average length in the thickness direction are obtained, the area of the above-mentioned alumina particles 12 can be obtained by cutting the glass ceramic body 10 at a plane along the thickness direction of the flat alumina particles 12, measuring an area of the individual flat alumina paricles 12 in an optional 100 μm$^2$ cross section by a scanning electron microscope (SEM) and an image analyzer and calculating the total. Further, in a case where a glass ceramic body is prepared by firing a green sheet formed by a doctor blade method, its cutting direction is in a direction substantially parallel to the forming direction in the doctor blade method.

As the blend proportion of a flat alumina powder as a starting material powder of a glass ceramic body for obtaining the above-mentioned area, in the total amount 100 mass % of the glass powder and the alumina powder, the flat alumina powder is preferably from 40 to 60 mass %. The more preferred blend proportion of the flat alumina powder is from 45 to 55 mass %. Further, the flat alumina powder here means one having an average major diameter of from 2 to 10 μm as an average of the maximum length in the flat direction and an average thickness of from 0.05 to 0.5 μm as an average of the length in the thickness direction as mentioned above. When the proportion of the flat alumina powder is at least 40 mass %, the number of times that incident light colloids with interfaces between the glass matrix 11 and the flat alumina powder 12 can be increased, whereby a high reflectance can be obtained, and the firing shrinkage in the flat direction can be suppressed. On the other hand, when the proportion of the alumina powder is at most 60 mass %, the proportion of the glass matrix 11 is low, whereby the deterioration of the sintering property can be suppressed.

Further, in this specification, basically, when alumina particles are used as an alumina starting material, it is referred to as "alumina powder". In a case of alumina particles produced from an alumina powder as a starting material, in a case of an alumina dispersed in a glass ceramic body or in a case where individual characteristics of alumina are described, they are referred to as "alumina particles". However, when it is difficult to distinguish them, they are referred to as "alumina particles" or "alumina powder" in some case.

Alumina particles 12 having an α-alumina crystal structure and a crystal structure other than the α-alumina crystal structure are preferably those produced by subjecting aluminum hydroxide to hydrothermal synthesis to produce boehmite particles and subjecting the boehmite particles to heat treatment. According to such a method, by adjusting the heat treatment of the boehmite particles, particularly the temperature of the heat treatment, the crystal structure can be adjusted. Now, a production method will be specifically explained.

First, starting materials containing aluminum hydroxide and water are put in an autoclave and heated under pressure to carry out hydrothermal synthesis without stirring or with stirring at a low rate. A reaction product obtained by the hydrothermal synthesis is washed, filtrated and dried to obtain boehmite particles.

As a case requires, a pH adjustor may be added to reaction starting materials to adjust the pH to at least 8, preferably at least 11. The pH adjustor may, for example, be a hydroxide of an alkali metal such as sodium or potassium, a hydroxide of an alkaline earth metal such as barium, calcium or strontium or their aluminates.

By adding the pH adjustor to the reaction starting materials, the reaction system is made to be alkaline, whereby the solubility of aluminum hydroxide which is a starting material is increased, the reaction time may be reduced, and the size of boehmite particles can be made to be large compared with a case where the pH adjustor is not added.

The amount of water added as a reaction starting material is preferably from 2 to 25 times in the mass ratio per aluminum hydroxide. If the mass ratio is less than 2 times, the reaction material cannot be sufficiently reacted. On the other hand, if the mass ratio exceeds 25 times, an amount of useless water increases, and thereby product cost becomes high, and the productivity may be low.

Further, a monomer or a polymer of a (meth)acrylic acid ester is preferably added in the reaction starting material. In such a case, flat boehmite particles, namely flat alumina particles are easily obtained.

The monomer of the (meth)acrylic acid ester means an acrylic acid ester or a methacrylic acid ester, and these are generally referred to as (meth)acrylic acid ester. As specific examples of the (meth)acrylic acid ester, methyl acrylate, ethyl acrylate, propyl acrylate, butyl acrylate, heptyl acrylate, hexyl acrylate, octyl acrylate, nonyl acrylate, 2-ethylhetyl acrylate, dodecyl acrylate, butyl methacrylate, hexyl methacrylate, octyl methacrylate, decyl methacrylate, dodecyl methacrylate or hexadecyl methacrylate may be mentioned.

The polymer of the (meth)acrylic acid ester includes a polymer comprising only one type of the above-mentioned (meth)acrylic acid ester, a copolymer comprising such (meth)acrylic acid esters, and a polymer or a copolymer comprising the (meth)acrylic acid ester and another monomer such as ethylene or styrene.

The temperature in the autoclave at the time of the hydrothermal synthesis is preferably from 110 to 300° C. If the temperature is less than 110° C., it is difficult to produce boehmite particle as a reaction product. If the temperature exceeds 300° C., a large amount of energy to maintain such a temperature is consumed, and thereby it is disadvantageous from the viewpoint of cost.

Although the heating time varies depending on a situation of stirring or still standing, the reaction time is preferably from 4 to 24 hours. If the reaction time is less than 4 hours, aluminum hydroxide may be unreacted. On the other hand, if the reaction time exceeds 24 hours, the productivity deteriorates, and it is disadvantageous from the viewpoint of cost.

The alumina particles can be produced by firing the boehmite particles obtained by the above method at a temperature of, for example, from 450 to 1,500° C. by an electronic furnace or the like. Here, when the temperature is from 450 to 900° C., γ-alumina crystalline structure is mainly formed, when the temperature is from 900 to 1,100° C., δ-alumina crystalline structure is mainly formed, when the temperature is from 1,100 to 1,200° C., θ-alumina crystalline structure is mainly formed, and when the temperature is from 1,200 to 1,500° C., α-alumina crystalline structure is mainly formed. From the viewpoint of obtaining alumina particles having an α-alumina crystal structure and a crystal structure other than the α-alumina crystal structure, the boehmite particles are preferably fired at from 1150 to 1,300° C.

Alumina particles produced by firing boehmite particles maintain a shape of the boehmite particles before firing, irrespective of types of alumina. Thus, by using flat boehmite particles, flat alumina particles can be obtained.

The firing time is preferably from 1 to 4 hours, further preferably from 1.5 to 3.5 hours. If the firing time is less than 1 hour, firing is insufficient, and it is difficult to produce alumina particles. Further, since formation of alumina particles is almost finished within 4 hours, firing longer than 4 hours is not economical.

As the method for producing alumina particles 12, the above method is mentioned as a preferred method. However, so long as the designated crystalline structure and shape are formed, the method is not necessarily restricted to the above method, and a known production method may be appropriately adopted.

In the foregoing, the glass ceramic body 10 of the present invention is explained, the alumina particle 12 are not necessarily restricted to flat particles and may be spherical shape. Further, in the glass ceramic body 10 of the present invention, in addition to the alumina particles 12, as the case requires, so long as the object of the present invention is not impaired, an oxide ceramics such as silica, mica or zirconia or particles made of another ceramics may be contained. In the case where particles other than the alumina particles 12 are contained, the content of such other particles is at most 15 mass %, preferably at most 13 mass % in the total of the glass ceramic body 10.

Figure 3:
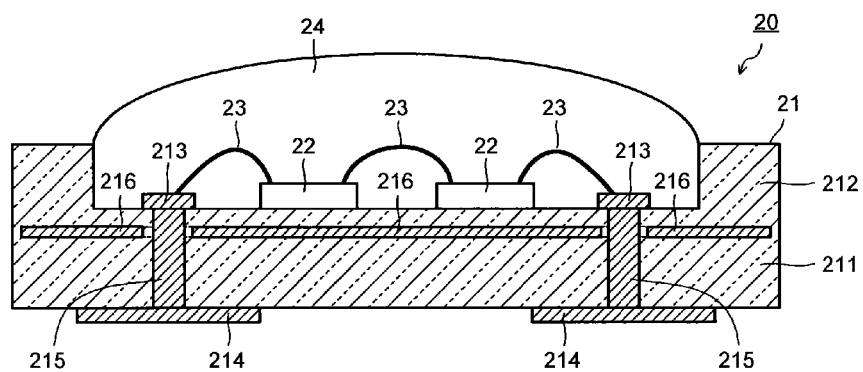
FIG. 3 is a cross-sectional view illustrating a light emitting device in an embodiment of the present invention.

Now, a substrate for mounting a light emitting element, which is provided with the glass ceramic body 10 of the present invention, and a light emitting device will be explained FIG. 3 is a cross section illustrating a light emitting device 20 provided with the glass ceramic body 10 of the present invention.

The light emitting device 20 has a substrate 21 for mounting a light emitting element wherein at least a part of the substrate is made of the glass ceramic body 10. Hereinafter, a substrate for mounting a light emitting element may is simply referred to as "substrate". For example, the substrate 21 is provided with two light emitting elements 22, electrically connected in series. The substrate 21 is provided with two light emitting elements 22, electrically connected by bonding wires 23 in series and provided with a sealing layer 24 so as to cover these light emitting elements 22 and the bonding wires 23 to produce a light emitting device 20.

The substrate 21 is constituted, for example, by a substantially flat substrate base 211 and a frame 212 which is set on one main surface of the substrate base 211. The mounting surface of the base substrate 211 on which light emitting elements 22 are mounted, is provided with a pair of element connection terminals 213, and the back surface of the substrate base 211 is provided with a pair of external connection terminals 214 which are electrically connected to a external circuit. The inside of the substrate base 211 is provided with a pair of through hole conductors 215 to electrically connect these element connection terminals 213 and external connection terminals 214. Further, in this specification, the substantially flat means flat at a level of visual observation.

Further, in the inside of the substrate base 211, a silver layer 216 as a heat release layer made of a metal material containing silver and having a film thickness of from 8 to 50 μm is formed so as to exclude a peripheral part of the substrate base 211, a part where a pair of the through hole conductors 215 are formed and a vicinity of its peripheral part.

Regarding such a substrate 21, a part excluding e.g. conductor portions such as the element connection terminals 213, the external connection terminals 214 and the through hole conductors 215, is the glass ceramic body 10 of the present invention. Further, the part of the glass ceramic body 10 may be at least a part other than the conductor portions, for example, be a part other than the conductor portions in the substrate base 211 or only a part to cover the silver layer 216 in the substrate base 211. When at least a part to cover the silver layer 216 is made of the glass ceramic body 10, at the time of production, particularly at the time of firing, the deterioration of a reflectance due to block coloration can be suppressed.

Further, in such a substrate 21, in a case where the alumina particles 12 have a flat shape, flat alumina particles 12 are usually dispersed so that the thickness direction of the flat alumina particles 12 would be the same as the thickness direction of the substrate 21, namely, so that the flat plane of the flat alumina particles would be substantially parallel to the substrate surface of the substrate 21 (namely, the lengthwise direction of the substrate).

Now, the method for producing the substrate for mounting a light emitting element 21 will be explained.

First, to a glass ceramic composition containing at least a glass powder and an alumina powder, a binder and as the case requires, a plasticizer, a solvent, a leveling agent, a dispersing agent, etc. are added to prepare a slurry. This slurry is formed into a sheet form e.g. by a doctor blade method, followed by drying, to produce a green sheet.

The glass powder can be obtained by producing by a melting method a glass material to be glass having a composition such that crystals are not formed within the above mentioned firing temperature range at the time of firing, followed by grinding the glass by a dry grinding method or a wet grinding method. In the case of a wet grinding method, it is preferred to use water as a solvent. The grinding can be carried out by using a grinding machine such as a roll mill, a ball mill or a jet mill.

The particle size of the glass powder is preferably from 0.5 μm to 3 μm by 50% particle size ($D_{50}$). If the 50% particle size of the glass powder is less than 0.5 μm, the glass powder is likely to cohere, whereby the handling tends to be difficult, and it tends to be difficult to uniformly disperse it. On the other hand, if the 50% particle size of the glass powder exceeds 3 μm, the glass softening temperature is likely to rise, or the sintering is likely to be inadequate. The particle size can be adjusted, for example, by classification after the grinding as the case requires. In this specification, the particle size of a powder is a value measured by a particle size analyzer (manufactured by Nikkiso Co., Ltd., tradename: MT3100II) of a laser diffraction scattering method.

On the other hand, as the alumina powder, one having an α-alumina crystal structure and a crystal structure other than the α-alumina crystal structure is used as mentioned above. The alumina powder preferably has a non α proportion of at most 70%, more preferably at most 60%, particularly preferably at most 50%. On the other hand, the non α proportion is preferably at least 1%, more preferably at least 2%, particularly preferably at least 5%. As the crystal structure other than the α-alumina crystal structure, a θ-alumina crystal structure is typical. Further, the above-mentioned alumina powder preferably contains a flat alumina powder of from 40 to 60 mass %.

To such a glass ceramic composition comprising the glass powder and the alumina powder, a binder is blended, and the case requires, a solvent (organic solvent), a plasticizer, etc. are added to obtain a slurry.

The binder may, for example, be preferably polyvinyl butyral or an acrylic resin. The plasticizer may, for example, be dibutyl phthalate, dioctyl phthalate or butyl benzyl phthalate. Further, the solvent may be an aromatic or alcohol organic solvent such as toluene, xylene or butanol. It is preferred to use a mixture of an aromatic solvent with an alcohol solvent. Further, it is also possible to use a dispersing agent or a leveling agent in combination.

The slurry has a composition comprising, for example, 54.1 mass % of solid content (glass powder+alumina powder), 36.5 mass % of an organic solvent (a solvent mixture of toluene, xylene, isopropyl alcohol (2-propanol) and 2-butanol), 0.8 mass % of a dispersing agent, 3.2 mass % of a plasticizer, and 5.4 mass % of a resin as a binder.

For preparation of the slurry, at least the glass powder and the alumina powder are added to a solvent mixture having a leveling agent and a dispersion agent mixed as the case requires with an organic solvent, and the mixture is stirred by a ball mill using $ZrO_2$ as a medium. A vehicle having a resin as a binder dissolved in an organic solvent is added thereto, followed by stirring by a propeller stirring rod, and then by filtration through a mesh filter. Bubbles included inside can be removed by stirring in vacuum.

Then, the obtained slurry is applied on the PET film coated with a release agent, for example, by a doctor blade to form a sheet, followed by drying to produce a green sheet. In a case where the alumina particles are flat, by such formation of the green sheet, it is possible to align the flat alumina particles so that they would be in the designated dispersion state.

That is, at the time of the application by the doctor blade method, the slurry containing the glass powder, the flat alumina powder, etc. will pass through a space formed by the tip of the blade portion of the doctor blade apparatus and the surface of the film, whereby the flow (streamline) of the slurry will be aligned along the film transportation direction. On that occasion, the flat alumina particles dispersed in the slurry also pass through the space so as to be aligned along the flow of the slurry. Accordingly, the flat alumina particles in the green sheet will be aligned so that the direction of their flat plane is in parallel to the plane direction of the sheet. Further, in a case where the flat plane has a lengthwise direction and a short direction, for example rectangle, the lengthwise direction would be substantially parallel to the forming direction in the doctor blade method.

On the green sheet, non-fired conductors such as a non-fired element connection terminal 213, a non-fired external connection terminal 214 and a non-fired through hole conductor 215 are formed, and a non-fired silver layer 216 to be a heat release layer is formed. The method for forming the non-fired conductors is not particularly restricted, and a conductor paste is applied by a screen printing method. As the conductor paste, one prepared by adding a vehicle such as ethylcellulose and as the case requires a solvent, etc. to a metal powder containing as the main component, for example, one of copper, silver, gold, aluminum, etc. may be used. The non-fired silver layer 216 is similarly formed as the method for forming the non-fired conductors. However, as a conductor paste for the non-fired silver layer 216, one containing at least silver as a metal powder, for example, a silver powder, an alloy powder containing silver and platinum or an alloy powder containing silver and palladium is used.

Then, a plurality of the above green sheets are overlaid with positioning, and then bonded by thermal compression. Then, binder burn out to decompose and remove the binder, etc. is carried out and then, firing is carried out to sinter the glass ceramic composition thereby to obtain a substrate 21.

Binder burn out is carried out preferably by holding the substrate, for example, at a temperature of at from 500° C. to 600° C. for from 1 to 10 hours. If the binder burn out temperature is lower than 500° C. or the binder burn out time is less than one hour, the binder, etc. may not sufficiently be decomposed and removed. When the binder burn out temperature is about 600° C. and the binder burn out time is about 10 hours, the binder, etc. can sufficiently be removed. However, if the binder burn out time exceeds 10 hours, the productivity, etc. may rather be deteriorated.

Firing is carried out by holding the substrate, for example, at a temperature of from 850° C. to 900° C. for from 20 minutes to 60 minutes, particularly preferably at a temperature of from 860° C. to 880° C. If the firing temperature is less than 850° C. or if the firing time is less than 20 minutes, a dense sintered product may not be obtained. When the firing temperature is about 900° C. and the firing time is about 60 minutes, a sufficiently dense product will be obtained, and if the firing temperature or the firing time exceeds the above range, the productivity, etc. may rather be deteriorated. Further, in a case where a conductor paste containing a metal powder containing silver as the main component is used, if the firing temperature exceeds 900° C., the conductor paste is softened too much, whereby the designated shape cannot be maintained.

According to such a production method, by a glass powder which is not formed into crystals in the firing temperature range at the time of firing, the unevenness of the firing shrinkage can be suppressed. Further, by using an alumina powder having an α-alumina crystal structure and a crystal structure other than the α-alumina crystal structure, when a non-fired silver layer is simultaneously fired to form a silver layer 216, blackening can be suppressed, and the strength, etc. can be maintained. The same effects can be obtained, in a case where a mixed powder comprising an alumina powder having an α-alumina crystal structure and an alumina powder having an α-alumina crystal structure and a crystal structure other than the α-alumina crystal structure is used.

Further, by using a flat alumina powder and firing it so that their individual thickness directions would be the substantially same direction, the firing shrinkage in the flat direction can be suppressed, and a reflectance is made to be high. By using an alumina powder having an α-alumina crystal structure and a crystal structure other than the α-alumina crystal structure, blackening can be effectively suppressed.

EXAMPLES

Now, the present invention will be described in detail with reference to specific Examples.

Working Examples

Examples 1 to 8

Comparative Examples

Examples 9 to 11

In order to attain a glass composition as shown in Table 2, respective glass materials were blended and mixed to obtain a material mixture. This material mixture was put in a platinum crucible and melted at from 1,200 to 1,500° C. for 60 minutes, and a melt was cast and cooled. Then, the cooled product was ground by an alumina ball mill using water as a solvent for from 10 to 60 hours and classified to obtain glass powders G1 to G5 having a composition as shown in Table 2.

Separately, a boehmite powder was produced by subjecting aluminum hydroxide to hydrothermal synthesis, and the boehmite powder was fired to obtain an alumina powder. That is, first, aluminum hydroxide, sodium hydroxide or calcium carbonate as a pH adjustor and water were charged in an autoclave. Here, the pH was adjusted to at least 8, and the content of water was at least 5 times of the amount of aluminum hydroxide by mass ratio. Then, they were reacted at from 150 to 200° C. for from 2 to 10 hours under normal pressure. Then, washing with water, filtration and cleaning were carried out to obtain flat boehmite particles.

Then, the flat boehmite powder was fired at from 800 to 1,300° C. to obtain a flat alumina powder having an average major diameter of from 2 to 3.5 μm as an average value of the maximum length in the flat direction, an average thickness of from 0.08 to 0.2 μm as an average value of the length in the thickness direction and an average cross-sectional particle aspect ratio (average major diameter/average thickness) of from 25 to 50 and having a different crystal structure and a different non α proportion. Further, the average aspect ratio, etc. were adjusted by adjusting the average aspect ratio, etc. at the time of producing the boehmite powder, and the crystal structure and the non α proportion were adjusted by adjusting the firing temperature of the flat boehmite powder.

Then, as shown in Table 3, a glass powder and an alumina powder or a boehmite powder were blended in designated proportions and mixed. Here, in Examples 1 to 8, as the alumina powder, one having an α-alumina crystal structure, and a crystal structure other than the α-alumina crystal structure mentioned in "Particle crystal" in Table 3 and a non α proportion of from 2 to 60% was used.

50 g of this mixed powder (glass ceramic composition) was blended with 15 g of an organic solvent (toluene, xylene, 2-propanol and 2-butanol were mixed in a mass ratio of 4:2:2:1), 2.5 g of a plasticizer (di-2-ethylhexyl phthalate), 5 g of a polyvinyl butyral (manufactured by Denki Kagaku Kogyo Kabushiki Kaisha, tradename: PVK#3000K) as a binder, and 0.5 g of a dispersant (manufactured by BYK Japan K.K., tradename: BYK180) and mixed to prepare a slurry. The slurry was applied on a PET film by a doctor blade method, dried and cut into 40 mm² green sheets (lengthwise 44 mm×crosswise 40 mm) having a thickness of 0.2 mm.

Then, the green sheets were overlaid and bonded by applying a pressure of 10 MPa at 80° C. Then, the green sheet was held in a firing furnace at 550° C. for 5 hours to decompose and remove the binder resin, and then held at 870° C. for 30 minutes to carry out firing. In such a manner, a substrate for measuring the strength and water absorption was obtained. The strength, the water absorption, etc. of the substrate were measured as described below. Further, the crystallinity of glass of the substrate was measured by X-ray diffraction. As a result, crystallization was not measured in all samples. Further, in Table 3, "–*1" in a line of "crystallinity of glass" means that a peak of glass having a intensity of at least 10 as an absolute value is not measured, when the highest intensity (absolute value) of peaks derived from ceramic particles such as alumina particles 12 is 100 in X-ray diffraction spectrum, as a result of measuring the crystallinity of glass by X-ray diffraction, with respect to the glass ceramic body obtained by firing the above green sheet.

(Average Flexural Strength)

The above-mentioned substrate was subjected to a three point flexural strength test in accordance with JIS C2141. That is, one side of the substrate was supported by 2 points, a load was gradually applied at the middle point between said 2 points on the opposite side, and a load when the substrate was cut was measured. Based on the load, a three points flexural strength (MPa) was calculated. By measuring 30 times of the flexural strength, an average value (average flexural strength) was obtained. Results are shown in Table 3.

(Water Absorption)

The water absorption of the above-mentioned substrate was measured in accordance with JIS R2205. That is, a dry weight of the substrate and a weight of a saturated substrate by a vacuum method were measured, and based on these values, the water absorption was calculated. Results are shown in Table 3. Further, the lower the value of the water absorption is, the less the number of open pores is.

(Shape of Particles)

The above-mentioned substrate was cut in the thickness direction and the direction substantially parallel to the forming direction by the doctor blade, and the cut surface was mirror polished. The length in the substrate surface direction and the length in the thickness direction of the substrate of individual flat alumina particles in a 100 μm² cross section were measured by means of a scanning electron microscope (SEM) and an image analyzer, and by averaging them, the average length of the length in the substrate surface direction and the average length of the length in the thickness direction of the substrate of the flat alumina particles were obtained. Further, an area of the flat alumina particles on the cross section was measured to obtain α proportion of area of the flat alumina particles per unit area.

Separately, a substrate for measuring a reflectance was produced.

First, a conductive powder (manufactured by Daiken Chemical Co., Ltd.) having an average particle size of about 2.5 μm, a small particle size distribution and a spherical shape and ethylcellulose was mixed in α proportion of 85:15 by mass ratio, a mixture was dispersed in a solvent (a terpineol) so that a solid content would be 85 mass %, followed by kneading in a ceramic mortar for 1 hour, and then dispersion was carried out 3 times by a triple roll mill to prepare a silver paste.

In the same manner as in one used for producing a substrate for measuring the strength and the water absorption, the silver paste was printed on a green sheet and dried. Then, another green sheet was overlaid on the silver paste and bonded by applying pressure of 10 MPa at 80° C. Here, the green sheet overlaid on the silver paste was one of which film thickness would be 120 μm after firing. Then, the green sheet was held in a firing furnace at 550° C. for 5 hours to decompose and remove the binder resin, and then held at 870° C. for 30 minutes to carry out firing. Thus, a substrate for measuring a reflectance having a silver layer in its inside was obtained.

A reflectance of a surface of the substrate for measuring a reflectance was measured. The reflectance was measured by a spectroscope USB2000 and a small integrating sphere ISP-$R^F$ manufactured Ocean Optics and calculated as a reflectance (unit: %) at 460 nm. Results are shown in Table 3.

TABLE 2

|  |  | G1 | G2 | G3 | G4 | G5 |
|---|---|---|---|---|---|---|
| Glass composition [mol %] | $SiO_2$ | 47.9 | 41.7 | 46.6 | 40.5 | 48.0 |
|  | $B_2O_3$ | 15.6 | 15.6 | 15.1 | 15.1 | 18.7 |
|  | ZnO | 0.0 | 0.0 | 0.0 | 0.0 | 0.0 |
|  | $Al_2O_3$ | 6.0 | 6.0 | 2.8 | 2.8 | 2.9 |
|  | MgO | 0.0 | 0.0 | 0.0 | 0.0 | 0.0 |
|  | CaO | 27.5 | 33.7 | 32.6 | 38.7 | 27.4 |
|  | SrO | 0.0 | 0.0 | 0.0 | 0.0 | 0.0 |
|  | BaO | 0.0 | 0.0 | 0.0 | 0.0 | 0.0 |
|  | $Li_2O$ | 0.0 | 0.0 | 0.0 | 0.0 | 0.0 |
|  | $Na_2O$ | 2.0 | 2.0 | 1.9 | 1.9 | 2.0 |
|  | $K_2O$ | 1.0 | 1.0 | 1.0 | 1.0 | 1.0 |

TABLE 3

| | | | Ex. 1 | Ex. 2 | Ex. 3 | Ex. 4 | Ex. 5 | Ex. 6 |
|---|---|---|---|---|---|---|---|---|
| Particle | Type | | Alumina | Alumina | Alumina | Alumina | Alumina | Alumina |
| | Content (mass %) | | 51 | 51 | 51 | 51 | 51 | 51 |
| Glass | Composition | | G1 | G1 | G1 | G1 | G2 | G3 |
| | Content (mass %) | | 49 | 49 | 49 | 49 | 49 | 49 |
| Substrate | Crystals of particles | Alumina crystal phase | α, θ | α, θ | α, θ | α, θ | α, θ | α, θ |
| | | Non α position (%) | 27 | 10 | 8 | 48 | 27 | 27 |
| | Size of particles (cross section in the thickness direction) | Average length of the substrate direction (μm) | 2.5 | 2.5 | 3.5 | 2 | 2.5 | 2.5 |
| | | Average length of the substrate thickness direction (μm) | 0.1 | 0.3 | 0.15 | 0.1 | 0.1 | 0.1 |
| | | Aspect ratio | 25 | 8 | 23 | 20 | 25 | 25 |
| | | Area ratio (%) | 41.1 | 40.8 | 44 | 43.2 | 41.1 | 41.1 |
| | Average flexural strength (MPa) | | 275 | 220 | 230 | 255 | 256 | 220 |
| | Adsorption | | 0 | 0 | 0 | 0 | 0 | 0 |
| | Reflectance (on the silver layer, 120 μm glass ceramic layer) | | 85 | 85 | 87 | 89 | 88 | 89 |
| | Glass crystallinity | | —*1 | —*1 | —*1 | —*1 | —*1 | —*1 |

TABLE 3-continued

| | | Ex. 7 | Ex. 8 | Ex. 9 | Ex. 10 | Ex. 11 |
|---|---|---|---|---|---|---|
| Particle | Type | Alumina | Alumina | Alumina | Alumina | Boehmite |
| | Content (mass %) | 51 | 51 | 51 | 51 | 51 |
| Glass | Composition | G4 | G5 | G1 | G1 | G1 |
| | Content (mass %) | 49 | 49 | 49 | 49 | 49 |
| Substrate Crystals of particles (cross section in the thickness direction) | Alumina crystal phase | α, θ | α, θ | α | γ | — |
| | Non α position (%) | 27 | 27 | 0 | 100 | 100 |
| | Size of particles Average length of the substrate direction (μm) | 2.5 | 2.5 | 2.5 | 3.5 | 3.5 |
| | Average length of the substrate thickness direction (μm) | 0.1 | 0.1 | 0.1 | 0.15 | 0.15 |
| | Aspect ratio | 25 | 25 | 25 | 23 | 23 |
| | Area ratio (%) | 41.1 | 41.1 | 39.7 | 47.2 | 46 |
| | Average flexural strength (MPa) | 260 | 255 | 290 | 100 | 80 |
| | Adsorption | 0 | 0 | 0 | 0 | 0 |
| | Reflectance (on the silver layer, 120 μm glass ceramic layer) | 89 | 88 | 64 | 90 | 86 |
| | Glass crystallinity | —*1 | —*1 | —*1 | —*1 | —*1 |

As is evident from Table 3, in the case of the substrates of Examples 1 to 8 in which alumina particles having an α-alumina crystal structure and a crystal structure other than the α-alumina crystal structure (for example, θ-alumina crystal structure) and a non α proportion of from 2 to 60% were used, blackening due to the formation of a silver layer can be effectively suppressed, a high reflectance can be obtained, and a high strength can be obtained.

INDUSTRIAL APPLICABILITY

According to the present invention, it is possible to provide a glass ceramic body wherein alumina particles are dispersed in a glass matrix, the glass matrix is not crystallized, and a ceramic part composed of the dispersed alumina particles has an α-alumina crystal structure and a crystal structure other than the α-alumina crystal structure, whereby the deterioration of a reflectance due to blackening can be suppressed, the unevenness in firing shrinkage can be suppressed, and the strength is high. By using such a glass ceramic body, it is possible to improve properties of a substrate for mounting a light emitting element and a light emitting device, such being useful.

This application is a continuation of PCT Application No. PCT/JP2012/069752, filed on Aug. 2, 2012, which is based upon and claims the benefit of priority from Japanese Patent Application No. 2011-174261 filed on Aug. 9, 2011. The contents of those applications are incorporated herein by reference in its entirety.

REFERENCE SYMBOLS

10: glass ceramic body, 11: glass matrix, 12: alumina particles, 20: light emitting device, 21: substrate for mounting a light emitting element, 22: light emitting element, 13: bonding wire, 24: sealing layer, 211: substrate base, 212: frame, 213: element connection terminal, 214: external connection terminal, 215: through hole conductor, 216: silver layer

What is claimed is:

1. A glass ceramic body comprising:
   a glass matrix; and
   a ceramic part comprising alumina particles, the alumina particles being dispersed in the glass matrix, wherein the glass matrix is not crystallized, the ceramic part comprises an α-alumina crystal structure and a crystal structure other than the α-alumina crystal structure, and the alumina particles have a flat shape and are dispersed in the glass matrix such that the thickness direction of each alumina particle is substantially the same direction.

2. The glass ceramic body according to claim 1, wherein in a cross-section along the thickness direction of the glass ceramic body, the average length of the flat direction of the alumina particles is from 2 to 10 μm, and the average length of the thickness direction of the alumina particles is from 0.05 to 0.5 μm.

3. The glass ceramic body according to claim 1, wherein in a cross-section along the thickness direction of the glass ceramic body, the area of the flat alumina particles per unit area is from 30 to 50%.

4. The glass ceramic body according to claim 2, wherein in a cross-section along the thickness direction of the glass ceramic body, the area of the flat alumina particles per unit area is from 30 to 50%.

5. The glass ceramic body according to claim 1, wherein when the total proportion of the α-alumina crystal structure and the crystal structure other than the α-alumina crystal structure is 100%, the proportion of the crystal structure other than the α-alumina crystal structure is from 1 to 70%.

6. The glass ceramic body according to claim 1, wherein the glass ceramic body has a flexural strength of at least 180 MPa.

7. The glass ceramic body according to claim 1, wherein the glass matrix comprises $SiO_2$—$B_2O_3$ glass containing from 15 to 40 mol% of CaO as represented by oxides base.

8. The glass ceramic body according to claim 1, wherein the glass ceramic body contains substantially no mullite crystal.

9. The glass ceramic body according to claim 1, wherein the glass ceramic body contains substantially no alumina particles having a Y-alumina crystal structure.

10. The glass ceramic body according to claim 1, wherein the crystal structure other than the α-alumina crystal structure is at least one crystal structure selected from the group consisting of a δ-alumina, a θ-alumina, an η-alumina, a χ-alumina and a κ-alumina.

11. The glass ceramic body according to claim 1, wherein the crystal structure other than the α-alumina crystal structure is a θ-alumina crystal structure.

12. A substrate for mounting a light emitting element, comprising the glass ceramic body as defined in claim 1.

13. A light emitting device comprising:
   the substrate as defined in claim 12; and
   a light emitting element mounted on the substrate.

14. The glass ceramic body according to claim 1, wherein a difference between a refractive index of glass constituting the glass matrix and a refractive index of alumina is at least 0.15.

15. The glass ceramic body according to claim 1, wherein a difference between a refractive index of glass constituting the glass matrix and a refractive index of alumina is at least 0.19.

16. The glass ceramic body according to claim 1, wherein when the total proportion of the α-alumina crystal structure and the crystal structure other than the α-alumina crystal structure is 100%, the proportion of the crystal structure other than the α-alumina crystal structure is from 5 to 60%.

17. The glass ceramic body according to claim 1, wherein in a cross-section along the thickness direction of the glass ceramic body, the area of the flat alumina particles per unit area is from 35 to 45%.

* * * * *